(12) United States Patent
Acharya

(10) Patent No.: US 6,195,026 B1
(45) Date of Patent: Feb. 27, 2001

(54) MMX OPTIMIZED DATA PACKING METHODOLOGY FOR ZERO RUN LENGTH AND VARIABLE LENGTH ENTROPY ENCODING

(75) Inventor: Tinku Acharya, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/152,703

(22) Filed: Sep. 14, 1998

(51) Int. Cl.⁷ ...................................................... H03M 7/00
(52) U.S. Cl. .................................................. 341/60; 341/65
(58) Field of Search ............................... 341/51, 60, 65; 348/384, 408; 382/232

(56) References Cited

U.S. PATENT DOCUMENTS

| | | | |
|---|---|---|---|
| 5,659,362 | * 8/1997 | Kovac et al. ........................ | 348/384 |
| 5,682,152 | * 10/1997 | Wang et al. ........................ | 341/50 |
| 5,793,314 | * 8/1998 | Auyeung ............................ | 341/51 |
| 5,910,783 | * 6/1999 | Pazmino ............................ | 341/60 |
| 5,995,149 | * 11/1999 | Saunders et al. .................... | 348/408 |
| 6,009,201 | * 12/1999 | Acharya ............................. | 382/232 |

\* cited by examiner

*Primary Examiner*—Trong Phan
(74) *Attorney, Agent, or Firm*—Blakely, Sokoloff, Taylor & Zafman LLP

(57) ABSTRACT

A method comprising entropy encoding into bits a set of data values, and packing into storage the entropy encoded bits by reversing the bits of words with unknown length and keeping in blocks the words with known lengths. For instance, in an entropy encoded data set that uses both Huffman coding and zero run coding, the class code may be reversed in bit order from right to left rather left to right while the words of known length such as the zero run code and Huffman pointer are stored left to right in blocks. This data arrangement is particularly useful in an MMX based machine.

27 Claims, 5 Drawing Sheets

MMX OPTIMIZED DATA PACKING METHODOLOGY FOR ZERO RUN LENGTH AND VARIABLE LENGTH ENTROPY ENCODING

BACKGROUND OF THE INVENTION

1. Field of the Invention

The invention relates generally to data and image processing. More specifically, the invention relates to arranging binary encoded data of a compressed image in computer memory.

2. Description of the Related Art

In image and/or data compression, through a process known as binary encoding, a set of values, such as text or numerical data that are obtained or input externally, can be encoded into binary form (1s or 0s). One way of encoding is to simply convert each decimal number or code for text (such as ASCII numerical designations) into a fixed number of bits (word size). For instance, the numbers 23, 128, and 100 would be encoded into binary as the sequence: 00010101 1000000 01100100. This raw or pure binary code serves no further compression function, since it merely takes the data and represents it in binary. Such encoding is inefficient where the number of zeroes greatly outweigh the non-zero, and especially where such zero data values are consecutive, creating a large "run" of zeroes in binary. Several methods have been developed particularly in the field of digital communications to compress data during binary conversion. Among two widely-used such methods of binary encoding for image or data compression are Huffman Coding and Run-Length Encoding.

Classical Huffman Coding is a variable length coding technique which consists of coding each possible value $y_i$ (i=1, ..., N) inside a given data set S of N possible data values by codewords of $L_i$ bits each. The goal behind Huffman Coding is to minimize $\Sigma L_i P(y_i)$, where $P(y_i)$ is the probability of the value $y_i$ occurring in data set S that is to be encoded. The codewords are chosen in order to make them distinguishable from each other. The codewords have a variable length, for instance, for a data set S={0, 1, 2, 3, 4} the Huffman Coding may use the mapping {0=0, 1=10, 2=110, 3=1110, 4=1111}. If $P(0)>>P(1)>>P(2)>>P(3)>>P(4)$, this technique may be more efficient than straight fixed length binary representation. The Huffman Coding is efficient primarily when coding data sets S with a small N or that have a small variance, since $L_i$ grows in size almost linearly with an increase in N, the number of values in the set. For this reason, a technique different from classical Huffman Coding known as Modified Huffman Coding has been developed and used in images that have larger N in their data sets or more variance.

Another technique known as Zero Run Length Coding (ZRLC) is a technique for encoding a data set containing a large number of consecutive or "runs" of zero values. ZRLC consists of encoding only the values different from zero (using Huffman Coding or some other coding) and then interleaving these codewords by a code that specifies the number of zeroes that, according to a manner known both to the coder and to the decoder, divides two consecutive non-zero values.

In traditional ZRLC, the encoded zero run data is structured using two segments: a run length and non-zero value. For instance, instead of coding the data stream:

{0 0 0 0 0 0 5 0 0 0 −6 78 0 0 0 0 −12 0 0 0 0 0 0 0 0 0 1 45 0 0 0 0 0 0 0 0 0 23} only the following data are coded:

{[6, 5][3, −6][0, 78][4, −12][11, 1][0, 45], [9, 23]}.

This code (where an_indicates a run length of zeroes) indicates that 6 zeroes followed by the value 5, then 3 zeroes followed by the value −6, then 0 zeroes followed by the value 78, ..., etc. Recently, an enhanced zero run encoding technique has been developed which is set forth as the subject of related U.S. patent application entitled *An Efficient Data Structure for Entropy Encoding Used in a DWT-Based High Performance Image Compression*, Ser. No. 09/140,517, filed on Aug. 26, 1998 (hereinafter "ZRC patent"). In most ZRLC, the zero run length is represented by a flag and an L bit word following the flag. In the ZRC patent, a single flag of "0" with no L-bit word succeeding it is used to indicate a run of exactly $2^L$ zeroes. When less than $2^L$ zeroes are encountered, a flag of "1" and a word of L-bits encoding the length in the direct binary equivalent of the size is utilized. For instance, referring to the above example, if L=2, then the first six zeroes would be encoded as "0 110". The first 0 refers to the first $2^2$ or 4 zeroes while the bits following it "110" are composed of the flag "1" and the length "10" (whose decimal equivalent is 2) which encodes the final two zeroes of the six zero run. The data stream has a non-zero value 5 which is Huffman coded. Following the Huffman code for "5", the next three zeroes are encoded by "111" (flag of 1 and run-length of "11" (3 in decimal). This process continues with non-zero values encoded by a Huffman code and zero values encoded by an enhanced zero run length encoding scheme. This combination of encoding is a form of "entropy encoding". In entropy encoding information is represented in a minimum number of bits in accordance with content (entropy) of the whole data set.

In data sets such as JPEG (Joint Photographic Experts Group) or DWT (Discrete Wavelet Transform) transformed image data that contain significant numbers of zero values, particularly zero values that are in continuous "runs", entropy encoding can be defined to include separate zero run and non-zero value encoding. The structure for encoding the zero runs, discussed also in the ZRC patent is composed of a Flag F=1 and a word R of L bits for any run or portion thereof consisting of less than $2^L$ zeroes or just contains the flag F=0 with no word R following it for any run or portion thereof. FIG. 1(a) shows one basic format 100 for entropy encoding that combines ZRLC with a variable length code for non-zero data values. In this format 100, a structure of the type (F, R) is followed by a variable length code V of M bits such as Huffman Coding of any non-zero values that follow the run of zeroes encoded by (F,R). The run, by definition, terminates when a non-zero value is encountered in the data set to be encoded. FIG. 1(b) is an example of the basic data format for the variable length coding technique known as Huffman coding. Referring to FIG. 1(a), the variable length code V, if it were a Huffman code would be composed of a "class code" and a "pointer" to a value within the class as typified in format 110 of FIG. 1(b). Each class code is a unique value which identifies a possible range of values for the value being encoding. Since zero values are encoded using ZRLC, unlike other Huffman codes, zero is excluded from the range of possible values. The table below shows an exemplary class code mapping for such Huffman coding:

| Class | Class Code | Possible Values within class |
|-------|------------|------------------------------|
| 1 | 11 | −1, +1 |
| 2 | 0 | −3, −2, +2, +3 |
| 3 | 10 | −7, . . . −4, +4, . . . −7 |

Since all zero values are encoded using ZRLC, only non-zero values need to be represented by the Huffman code. Each class which identifies a range of possible values has a class code. Class 1 has only two possible values, −1 and +1 and thus can use a one-bit pointer value to indicate which of the two values is being encoded. Class 2 represents 4 values and thus, should use a pointer of two bits to refer to one of the values ±2 or ±3. Likewise, class 3 values can be pointed to by a three-bit pointer. The value "−1" would be encoded by "110" [class code of "11" and pointer of "0"]. Likewise the value "5" would be encoded by "10101"[class code of "10" and a pointer of "101"]. Advantageously, a negative value is represented by the one's complement of the positive value and hence, the value "−5" would be encoded by "10010" [class code of "10" and one's complement of the pointer to "5"]. Thus, using ZRLC the string of values "005" would be encoded by "1 10 10 101" where the leading "1" is the flag for the ZRLC and the adjacent "10" the binary equivalent of the run length "2". The "10 101" following it is the Huffman coding for "5" given a Huffman mapping such as that described above and a ZRLC technique such as that presented in the ZRC patent with a code length L=2.

Once data has been entropy encoded or otherwise binary encoded, devices such as digital cameras or computer systems need to then store or "pack" the data such that it is suitable for transmission and subsequent decoding. For instance, in a digital device, the encoded data may be packed into "words" of a particular size such as a byte (8 bits) each. This allows the data to be loaded easily into registers or mechanisms that have a fixed size. Typically, encoded data is packed in a left to right ordering format 210 as shown in FIG. 2(*a*). This ordering is not suitable for recently developed Intel architectures such as processors based upon MMX Technology (a product of Intel corporation). These processors follow the convention known in the art as "Little Endian" in which the memory byte ordering is right to left rather than left to right format 220 as shown in FIG. 2(*b*). With Little Endian, as shown in FIG. 2(*b*), a 4 byte (32-bit) register when stored into memory would be as follows. Starting from an offset location I, byte 0 would be stored in I+0, byte 1 in I+1, etc. with each byte having the most significant bit on the left side and the least significant bit on the right. Since entropy encoding is a variable length technique (the anticipated total length for encoding a set of data is unknown beforehand), the ability to shift out a block of bits all in one clock cycle can be used to advantageously reduce the amount of serial data transfers. However, considering the reverse nature of the register and memory storage within an MMX system, not all of the encoded data can be retrieved at variable length, some of it must be serially transferred and decoded bit-by-bit. Thus, there is needed an efficient data packing methodology for entropy encoded data which speeds and eases the decoding process by taking advantage of the characteristic properties of entropy encoded data.

SUMMARY

What is disclosed is a method comprising entropy encoding a set of data values into bits, and packing into storage the entropy encoded bits by reversing the bits of words with unknown length and keeping in blocks the words with known lengths.

BRIEF DESCRIPTION OF THE DRAWINGS

The objects, features and advantages of the method and apparatus for the present invention will be apparent from the following description in which:

FIG. 2(*b*) illustrates data packing in certain MMX based systems.

DETAIED DESCRIPTION OF THE INVENTION

Referring to the figures, exemplary embodiments of the invention will now be described. The exemplary embodiments are provided to illustrate aspects of the invention and should not be construed as limiting the scope of the invention. The exemplary embodiments are primarily described with reference to block diagrams or flowcharts. As to the flowcharts, each block within the flowcharts represents both a method step and an apparatus element for performing the method step. Depending upon the implementation, the corresponding apparatus element may be configured in hardware, software, firmware or combinations thereof.

Figure 3:
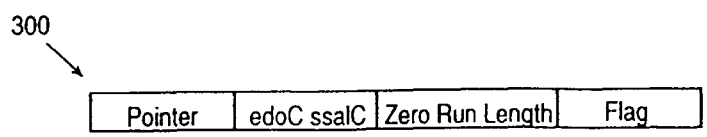
FIG. 3 illustrates an embodiment of the invention.

FIG. 3 illustrates one embodiment of the invention.

Figure 2A:
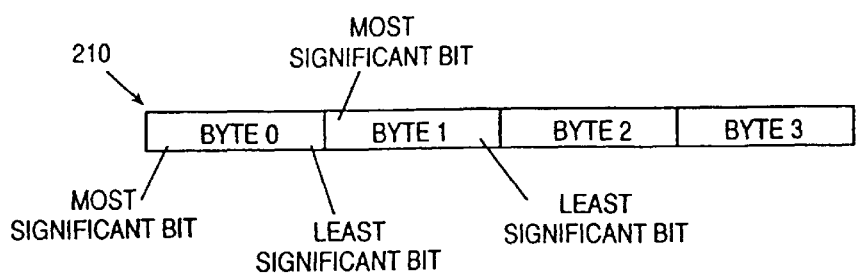
FIG. 2(*a*) illustrates conventional data packing.
Figure 2B:
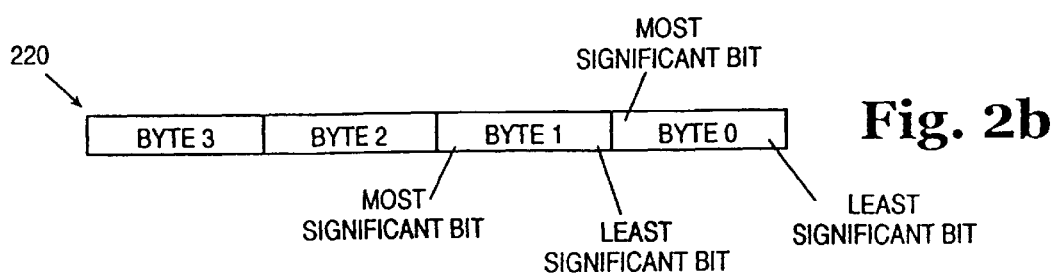

In an MMX-based machine, as shown in data structure 220 FIG. 2(*b*), data is organized in a right to left fashion in regards to the ordering of bytes. Typically therefore, the binary encoding for a sequence of values would also have to be stored right to left and then read out bit-by-bit in a serial manner. This arrangement would make decoding of entropy encoded data sets exclusively serial in nature. While this arrangement avoids byte swapping needed for "Big Endian" conventions (left to right byte ordering as shown in FIG. 2(*a*)), it has the disadvantage of making decode a bit-by-bit process, where a bit of each byte read out must be analyzed before the next can be decoded. However, by utilizing properties of entropy encoding, particularly taking advantage of fixed-length segments within the variable length code, the amount of serial bit-by-bit decoding can be reduced and thus the speed of decode, increased.

Figure 1A:
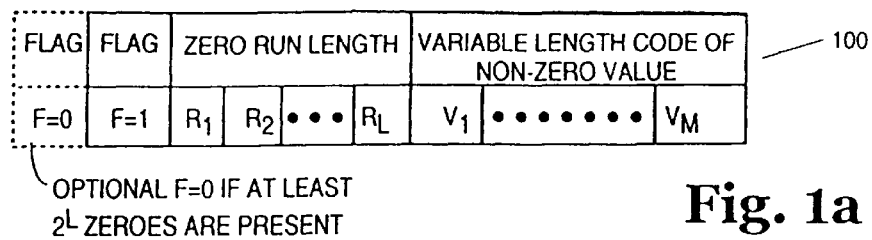
FIGS. 1(*a*)–1(*b*) show an entropy encoding scheme that utilizes zero run length encoding and Huffman coding.
Figure 1B:
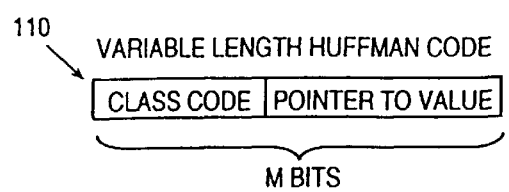

FIG. 3 shows one such packing arrangement 300 according to an embodiment of the invention. First, the part of the code that results from the ZRLC which consists of a Flag and Zero Run Length or just a flag of 0 is "fixed" in size. The Zero Run Length is a set of bits with a known length L as discussed above. Since the length of the ZRLC code after a flag of 1 is known, the Zero Run Length value may be shifted out all at once and does not need to be serially decoded. Thus, the bits representing Zero Run Length may be stored in a left to right fashion rather than in reverse order. Referring back to FIG. 1(a), a flag of zero may also be generated by the ZRC, which has no Zero Run Length value following it. In this case since the length (one bit for the flag) is known, any zero flags which precede the (F,R) structure will be recognized correctly upon decode.

According to the ZRC Patent, each code for a non-zero value is preceded by a Zero Run Length code having the structure (F,R) whether or not zero values immediately precede the non-zero value. Accordingly, when two non-zero values are adjacent to each other in the data stream that is being encoded, a separator ZRC structure of 1 followed by L zeroes is inserted therebetween. Further, where the zero run is an exact multiple of $2^L$, a structure of 1 followed by L zeroes is placed as a separator before the variable length code for the non-zero value is output. This guarantees that the decoder will be able to recognize when the variable length code such as the Huffman code is encountered.

The Huffman code is a partly variable and partly fixed length code in that once the class is known, all the possible pointers to that class are of a fixed number of bits. However, the class code is often of unpredictable length. In the example given above for the Huffman table only three classes were defined, each class code having only two bits (except for class 2). However, such a case is not typical since there are usually many classes in most Huffman coding schemes, depending on the nature of the data to be encoded. And in accordance with the goal of entropy encoding, certain ranges should advantageously have a smaller size class code than other ranges whose value are lower in probability of occurrence. Thus, class 1 may have 2 bits and class 2 may have 3 bits to denote the class code.

Below is an example of a Huffman table with variable length class codes:

| Class | Code | Pointer Size |
|---|---|---|
| 1 | 10 | 1 bit |
| 2 | 110 | 2 bits |
| 3 | 1110 | 3 bits |
| 4 | 11110 | 4 bits |
| 5 | 11110 | 5 bits |

Thus, in the Huffman table above the class code is a variable length. However, once the class code is known, the pointer is a fixed number of bits, such as three in the case of class three. Since the class code is bit-serial unique such that a serial bit-by-bit analysis would allow a decoder to correctly identify the class, the class code may be decoded bit-by-bit in a serial fashion. In other words, Huffman coding maintains a prefixing property such that no binary code is a prefix (ordered subset) of any other binary code. Thus, in one embodiment of the invention, the class code may be reversed in bit order. When the class code is decoded bit-by-bit, it will indicate which class the pointer belongs to. Since each class has by definition a fixed number of bits for the pointer field, the pointer may be stored in a left to right direction as with the Zero Run Length value. Once the class information is decoded, then a shift of the appropriate number of bits will present the decoder with the pointer without the need to reverse the bits or shift them out bit-by-bit in order to decode them. One advantage of the arrangement in FIG. 3 is speed. In the MMX based system, such an arrangement of the entropy code results in only the class code being serially decoded. All other information is shifted out in a single block based upon the length that the block should be. Referring to the example discussed above, the code for "005" which is "1 10 10 101" would be stored as "101 01 10 1" in right justification. Importantly, the class code "10" for the value 5 is stored in reverse order as "01" while all the flags, Zero Run Length value and pointer are all stored in left to right blocks.

Figure 4:
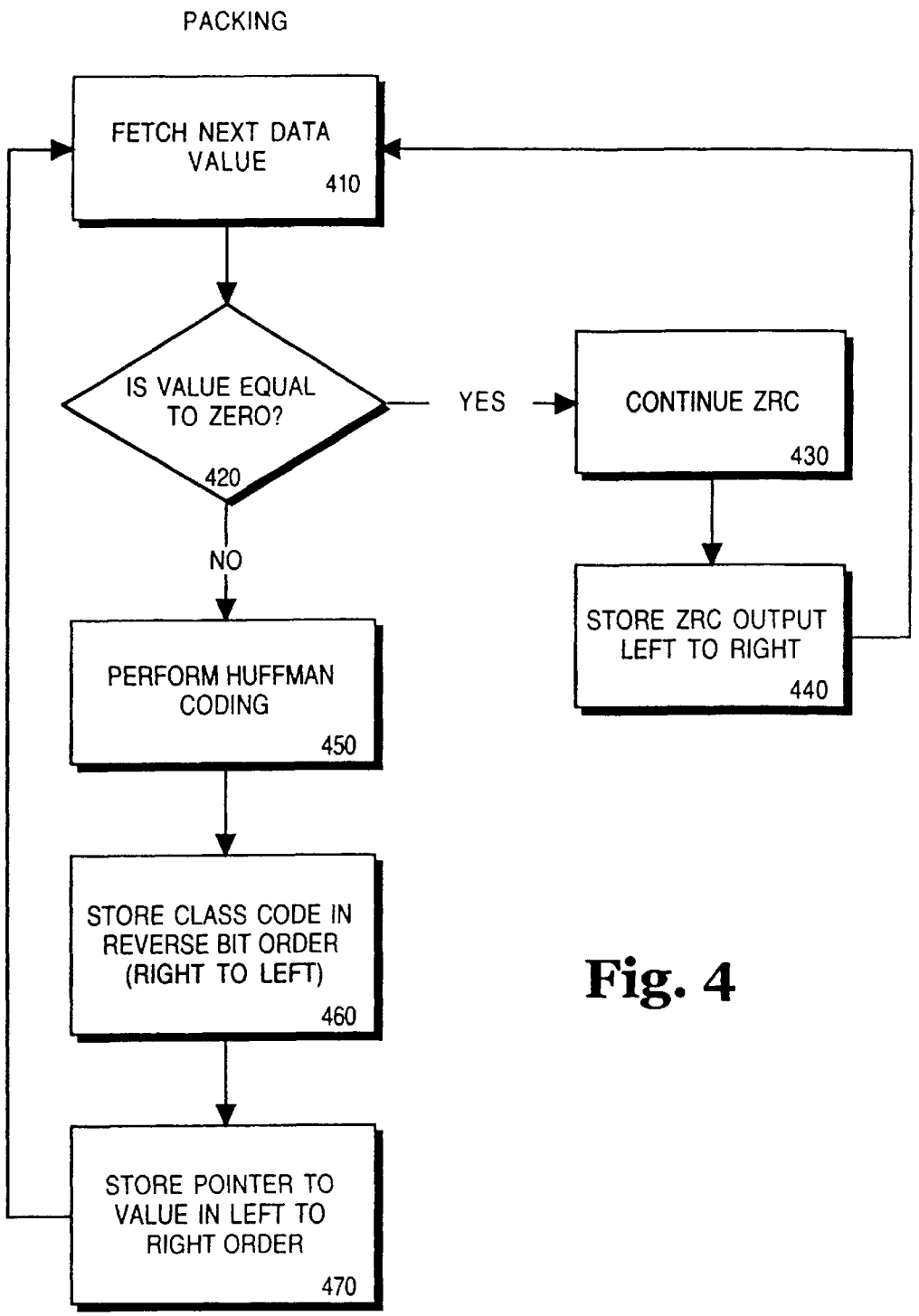
FIG. 4 is a diagram of a modified zero run length encoder and packet according to one embodiment of the invention.

FIG. 4 is a flow diagram of a encoding and packing scheme according to an embodiment of the invention.

When a data set containing many values, both zero and non-zero is ready to stored into binary it is often binary encoded. The binary encoding discussed throughout is entropy encoding and employs both a Huffman encoding for non-zero values and a ZRC for all zero values encountered. When this data is encoded, it may also be simultaneously packed for storage as shown in FIG. 4. Alternatively, where latency of further operations needs to be reduced, the entire encoded data set (or portion thereof) can be temporarily stored in typical left to right fashion and then packed at a later time. First, each (next) data value is fetched (block 410). If the data value is a zero (checked at block 420), then it should be coded by ZRC. Thus, with each encountered zero, the ZRC process is continued (block 430). Since the ZRC, including flags of zero with no Zero Run Length value have a known number of bits, the output of the ZRC may be stored in a left to right order (block 440). Where the output of the ZRC is still being constituted (not shown), then the block 440 would be in a wait state. For instance, when less than $2^L$ zeroes have been encountered, no "output" is possible until the non-zero value is encountered. Further, the flag of zero is only output when exactly $2^L$ zeroes have been encountered (see ZRC patent), and thus, the ZRC may need to be counting rather than outputting a value. These conditions are not illustrated in the diagram of FIG. 4 so as not to obscure the invention. If a non-zero value is encountered (check at block 420), then Huffman coding is performed (block 450). The class code, which is obtained first by look-up in a table, for instance, is stored in a right to left or reverse bit order consistent with serial decoding for an MMX-based system (block 460). Finally, the pointer to the value within the class is stored, but in left to right order since the decoder will be able to shift it as a block rather than serially (block 470). The process shown in blocks 410 through 470 repeats for each data value in the data set. Also not shown is the case where separators are introduced as described above which have a flag of 1 followed by L (the word size of the Zero Run Length value) zeroes. Once the data is packed in this manner, it may be decoded, and in anticipation of MMX type right-to-left bit ordering, advantageously so.

Figure 5:
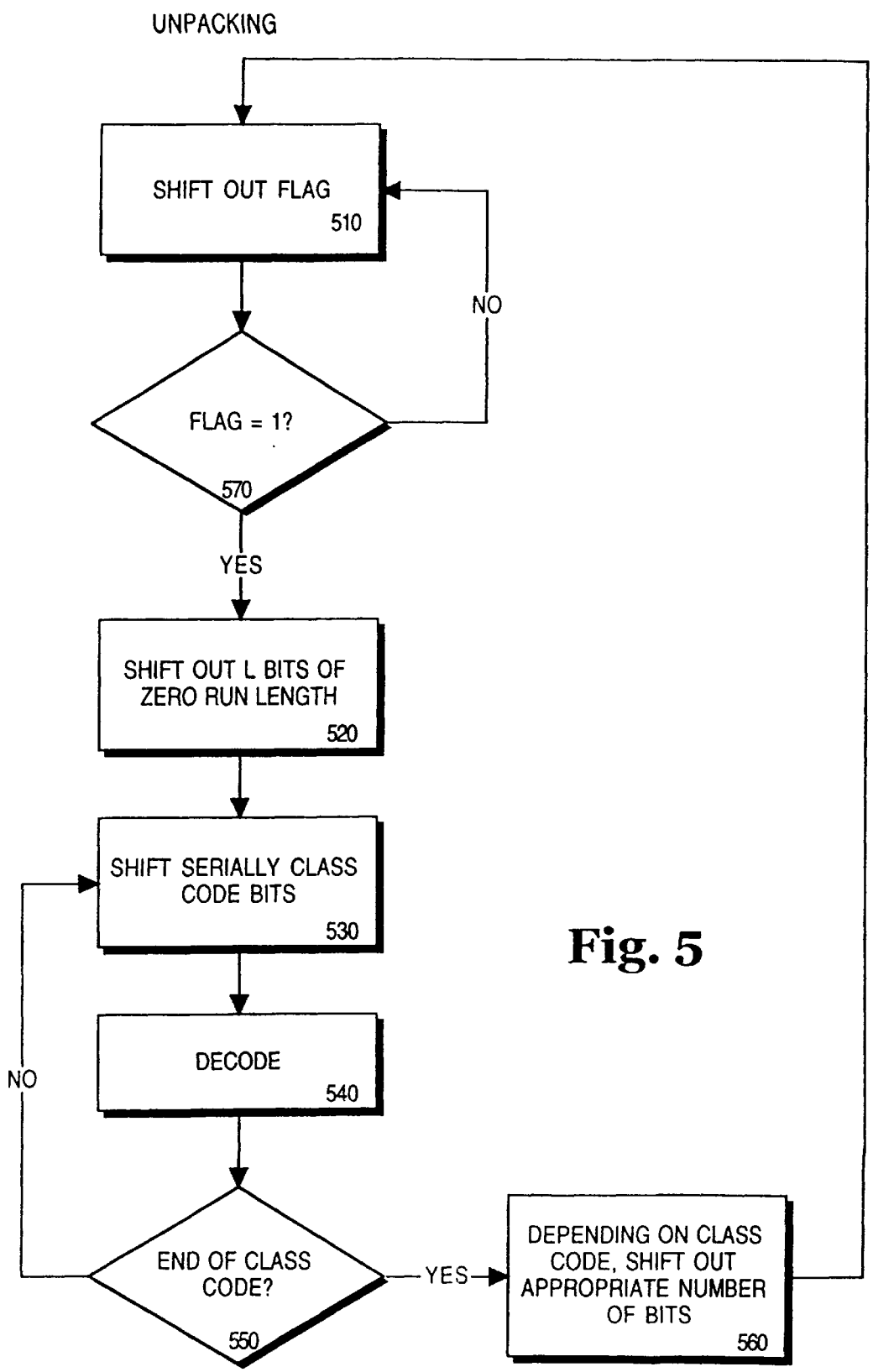
FIG. 5 is a block diagram of an adaptive decoder according to one embodiment of the invention.

FIG. 5 illustrates data unpacking according to an embodiment of the invention. When encountering an encoded and packed data set such as that resultant from the process illustrated in FIG. 4, such data may be unpacked as shown in FIG. 5. The very first element in the data set is by design a flag for the ZRC (see ZRC Patent). Thus, the first step is to shift out a singe bit flag (block 510). If the flag is zero and not one (checked at block 570), then this represents the encoding of $2^L$ zeroes (which the decoder can output) and then the next flag can be shifted out (block 510). If the flag is one (block 570) then the next L bits that are stored as the Zero Run Length value may be shifted out (and then appropriately acted upon by the decoder) (block 520). After a zero run code that has a flag 1 and L bits, by definition, a non-zero value should have been in the original data set. Since these non-zero values are represented by Huffman coding, the next bit(s) should be the class code information.

Since the class code is unknown length, it must be serially decoded. Thus, a serial shift of the class code bits is performed (block 530). Each bit is analyzed and decoded (block 540) along with preceding class code bits until the class code can be identified. When the class code bits have ended (i.e., the class is capable of being identified) then, depending on which class was denoted in the class code, the appropriate number of bits for the pointer value may be block shifted (block 560). A Huffman table may also contain the length information for pointers in that class, thus allowing a look-up for the size of the block to be shifted out. After the non-zero value is decoded (or after all Huffman code bits for the non-zero value is shifted out), the next bit is by design a flag for a ZRC (even if no zeroes are present) which is shifted out (block 510). The process of unpacking (and decoding if desired) continues with the blocks 510 through 570 repeating until the entire packed data set has been processed.

Figure 6:
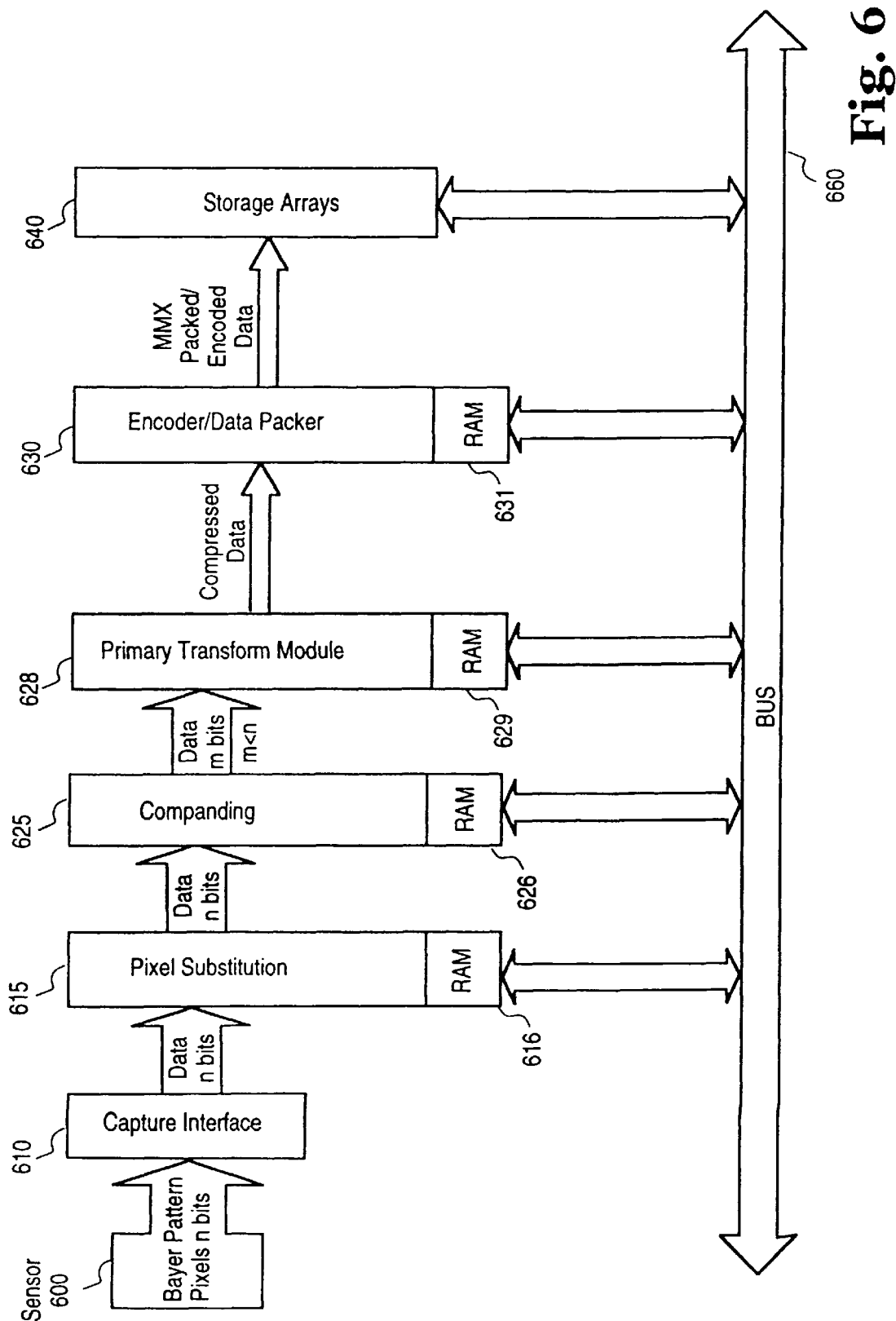
FIG. 6 is a block diagram of an image processing apparatus according to an embodiment of the invention.

FIG. 6 is a block diagram of an image processing apparatus according to an embodiment of the invention.

FIG. 6 is a block diagram of internal image processing components of an imaging device incorporating at least one embodiment of the invention including an adaptive encoder. In the exemplary circuit of FIG. 6, a sensor 600 generates pixel components which are color/intensity values from some scene/environment. The n-bit pixel values generated by sensor 600 are sent to a capture interface 610. Sensor 600 in the context relating to the invention will typically sense one of either R, G, or B components from one "sense" of an area or location. Thus, the intensity value of each pixel is associated with only one of three (or four if G1 and G2 are considered separately) color planes and may form together a Bayer pattern raw image. These R, G and B color "channels" may be compressed and encoded separately or in combination, whichever is desired by the application. Capture interface 610 resolves the image generated by the sensor and assigns intensity values to the individual pixels. The set of all such pixels for the entire image is in a Bayer pattern in accordance with typical industry implementation of digital camera sensors.

It is typical in any sensor device that some of the pixel cells in the sensor plane may not respond to the lighting condition in the scene/environment properly. As a result, the pixel values generated from these cell may be defective. These pixels are called "dead pixels." The "pixel substitution" unit 615 replaces each dead pixel by the immediate previously valid pixel in the row. A RAM 616 consists of the row and column indices of the dead pixels, which are supplied by the sensor. This RAM 616 helps to identify the location of dead pixels in relation to the captured image. Companding module 625 is designed to convert each original pixel of n-bit (typically n=10) intensity captured from the sensor to an m-bit intensity value, where m<n (typically, m=8). Companding module 625 is not needed if the sensor 600 and capture interface 610 provide an m-bit per-pixel value.

A primary transform module 628 receives companded sensor image data and performs image compression such as the DWT based compression. A RAM 629 can be used to store DWT coefficients and other information in executing DWT compression techniques. Primary transform module 628 can be designed to provide compressed channel by channel and sub-band by sub-band outputs to Encoder/Data Packer 630. Encoder/Data Packer 630 may be designed similar to the design presented in FIG. 4. Encoder/data packer 630 can be equipped to carry out a variety of binary encoding schemes, such as entropy encoding and data packing as described above. A RAM 631 may be configured to store the variable length encoding look up tables and the zero run length parameters utilized by the Encoder/Data Packer 630. Encoder/Data Packer 630 provides the encoded and packed data (in a MMX friendly arrangement) to storage arrays 640. Encoder/Data Packer 630 reverse the bits for only the Huffman class code (and stored these in reverse order in storage arrays 640) such that the remaining portions comprising the code set can be shifted out in block of known size.

Each of the RAM tables 616, 626, 629 and 631 can directly communicate with a bus 660 so that their data can be loaded and then later, if desired, modified. Further, those RAM tables and other RAM tables may be used to store intermediate result data as needed. When the data in storage arrays 640 is ready to be transferred external to the imaging apparatus of FIG. 6 it may be placed upon bus 660 for transfer. Bus 660 also facilitates the update of RAM tables 616, 626, 629 and 631 as desired.

Figure 7:
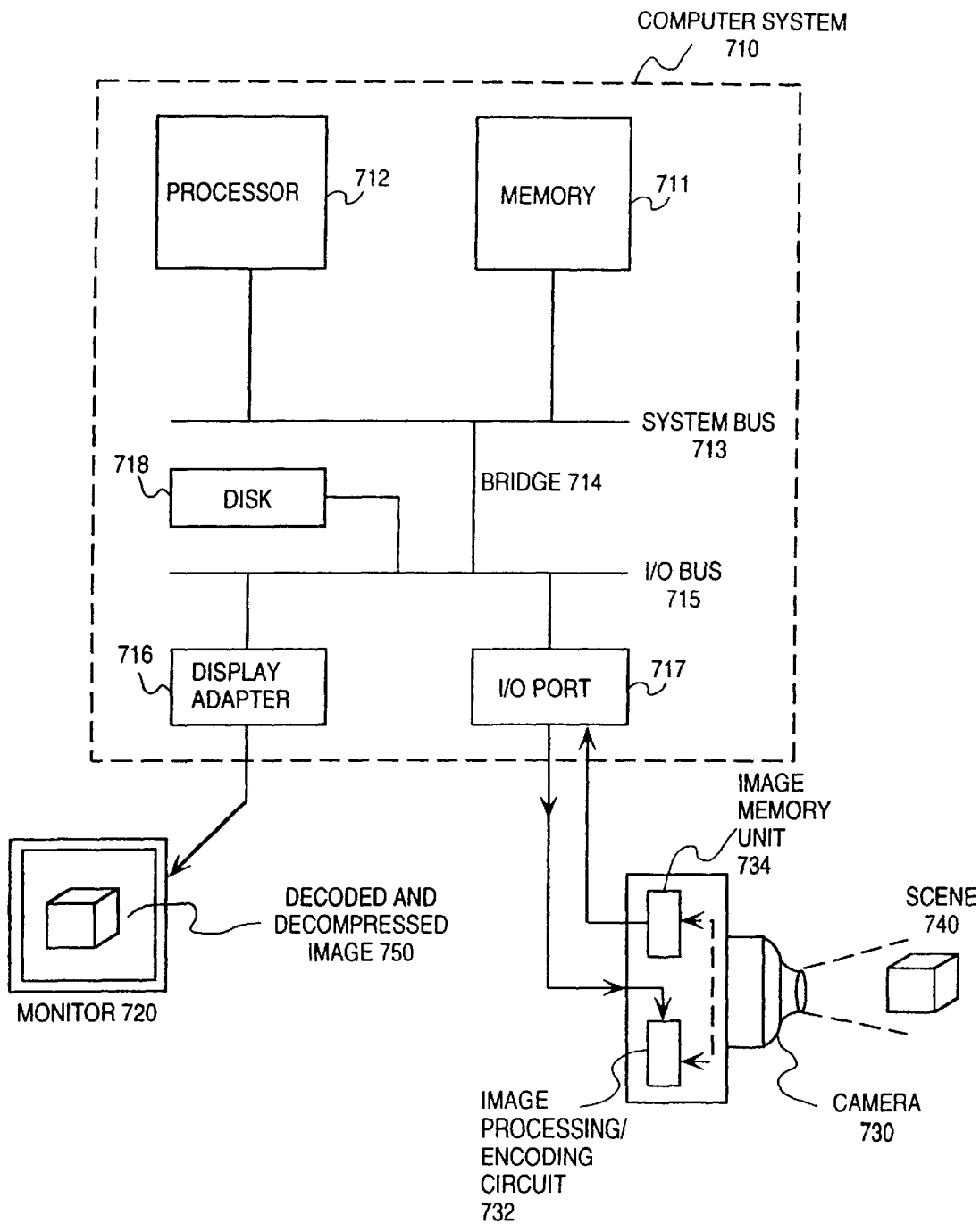
FIG. 7 is a system diagram of one embodiment of the invention.

FIG. 7 is a system diagram of one embodiment of the invention.

Illustrated is a computer system 710, which may be any general or special purpose computing or data processing machine such as a PC (personal computer), coupled to a camera 730. Camera 730 may be a digital camera, digital video camera, or any image capture device or imaging system, or combination thereof and is utilized to capture an image of a scene 740. Essentially, captured images are processed by an image processing circuit 732 so that they can be efficiently stored in an image memory unit 734, which may be a RAM or other storage device such as a fixed disk. The image contained within image memory unit 734 that is destined for computer system 710 can be according to one embodiment of the invention, stored directly as a compressed and MMX friendly encoded image data set. In most digital cameras that can perform still imaging, images are stored first and downloaded later. This allows the camera 730 to capture the next object/scene quickly without additional delay. The invention in its various embodiments reduces the decoding requirements of images captured from the camera 730, allowing for a more efficient system of image processing.

The image processing circuit 732 carries out the compression and enhanced zero run encoding in accordance with one or more embodiments of the invention. When a compressed and encoded image is downloaded to computer system 710, it may be decoded and then rendered to some output device such as a printer (not shown) or to a monitor device 720. Image decoding may be achieved using a processor 712 such as the Pentium™ processor with MMX Technology (a product of Intel Corporation) and a memory 711, such as RAM, which is used to store/load instruction addresses and result data. Portions of memory 711 (and registers and other components of processor 712) may store data justified in a right to left rather than the conventional left to right manner. Computer system 710 may provide to camera 730 the look-up tables needed for variable length Huffman value encoding.

The application(s) used to perform the unpacking and/or decoding of the data set after download from camera 730 may be from an executable compiled from source code written in a language such as C++. The instructions of that executable file, which correspond with instructions necessary to pack/unpack an encode/decode image data, may be stored to a disk 718 or memory 711. Further, such application software may be distributed on a network or a computer-readable medium for use with other systems.

When an image, such as an image of a scene 740, is captured by camera 730, it is sent to the image processing circuit 732. Image processing circuit 732 consists of ICs and other components which execute, among other functions, the encoding and MMX friendly data packing of a data set such as an image. The image memory unit 734 will store the compressed/encoded/packed data. Once all pixels are processed and stored or transferred to the computer system 710 for rendering the camera 730 is free to capture the next image. When the user or application desires/requests a download of images, the encoded image data in the image memory unit, are transferred from image memory unit 734 to the I/O port 717. I/O port 717 uses the bus-bridge hierarchy shown (I/O bus 715 to bridge 714 to system bus 713) to temporarily store the data into memory 711 or, optionally, disk 718. Computer system 710 has a system bus 713 which facilitates information transfer to/from the processor 712 and memory 711 and a bridge 714 which couples to an I/O bus 715. I/O bus 715 connects various I/O devices such as a display adapter 716, disk 718 and an I/O port 717, such as a serial port. Many such combinations of I/O devices, buses and bridges can be utilized with the invention and the combination shown is merely illustrative of one such possible combination.

In another embodiment of the invention, the MMX friendly data packing scheme may be utilized in arranging ordinary nonimage data where portions have known of fixed lengths of words such that these can be stored left to right and those unknown length words bit reversed with the packed byte. Such data may be stored in a disk, memory 711 or other storage mechanism and can be packed after being entropy encoded.

The exemplary embodiments described herein are provided merely to illustrate the principles of the invention and should not be construed as limiting the scope of the invention. Rather, the principles of the invention may be applied to a wide range of systems to achieve the advantages described herein and to achieve other advantages or to satisfy other objectives as well.

What is claimed is:

1. A method comprising:
   entropy encoding a set of data values into bits; and
   packing into storage the entropy encoded bits by packing two or more bits of a variable length sequence of bits in reverse order into storage and packing blocks of bits for a fixed length sequence of bits in an unreversed order into storage.

2. A method according to claim 1 wherein the entropy encoding includes Huffman coding for each of a plurality of non-zero data values, the Huffman coding including bits representing a class code and bits representing a pointer.

3. A method according to claim 2 wherein the bits representing the class code is a variable length sequence of bits, and wherein the length of the bits representing the pointer is a known fixed length sequence of bits when the bits representing a class code are identified.

4. A method according to claim 1 wherein the entropy encoding includes zero run coding, wherein one or more zeros may be represented by bits representing a flag and bits representing an optional zero run length value.

5. A method according to claim 4 wherein the order of bits representing the flag and the optional zero run length value are not reversed.

6. A method according to claim 3 wherein the order of bits representing the pointer is not reversed.

7. A method according to claim 1 wherein reverse order denotes the ordering of bits with the most significant bits right justified.

8. A machine-readable medium having stored thereon data representing sequences of instructions, the sequences of instructions which, when executed by a processor, cause the processor to:
   entropy encode a set of data values into bits; and
   pack into storage the entropy encoded bits by packing two or more bits of a variable length sequence of bits in reverse order into storage and packing blocks of bits for a fixed length sequence of bits in an unreversed order into storage.

9. An imaging system comprising:
   a data packer to binary encode a data set of zero and non-zero values, the data packer to arrange the binary code such that the packing order of a plurality of bits from a most significant bit to a least significant bit for a variable length sequence of bits is right to left and the packing order of bits from a most significant bit to a least significant bit for a fixed length sequence of bits is left to right.

10. An imaging system according to claim 9 further comprising a compressor coupled with the data packer, the data packer to receive the data set of zero and non-zero values as compressed image data output by the compressor.

11. An imaging system according to claim 9 comprising:
    a storage array coupled with the data packer, the storage array to store the binary encoded data produced by the data packer, the storage array arranging data as specified by the data packer.

12. An imaging system according to claim 10, wherein the data packer and the compressor are incorporated in a digital camera.

13. An imaging system according to claim 12 further comprising:
    a computer system coupled with the data packer, to unpack and decode the packed binary encoded bits, by serially unpacking and decoding bit-by-bit a plurality of bits from a most significant bit to a least significant bit of a variable length sequence of bits and shifting out in blocks bits of a fixed length sequence of bits.

14. An imaging system according to claim 13 wherein said computer system is based upon MMX technology.

15. The machine-readable medium of claim 8, wherein the instructions to entropy encode further comprise instructions which, when executed by a machine, cause the machine to Huffinan code each of a plurality of non-zero data values, the Huffman coding including bits representing a class code and bits representing a pointer.

16. The machine-readable medium of claim 15, wherein the bits representing the class code is a variable length sequence of bits, and wherein the length of the bits representing the pointer is a known fixed length sequence of bits when the bits representing a class code are identified.

17. The machine-readable medium of claim 8, wherein the instructions for reversing the bits of words further comprise instructions which, when executed by a machine, cause the machine to order the bits so that the most significant bit is right justified in a memory location.

18. A method of unpacking a plurality of packed binary encoded bits comprising serially unpacking and decoding bit-by-bit a plurality of bits from a right justified most significant bit to a least significant bit of a variable length sequence of bits and shifting out in blocks bits of a fixed length sequence of bits, wherein the order of the most significant bit to the least significant bit of the fixed length sequence of bits is left to right.

19. The method of claim 18 wherein serially unpacking and decoding comprises serially unpacking bit-by-bit a plurality of bits representing a class code and decoding the serially unpacked bits until the class code is identified, and wherein shifting out comprises shifting out in a block an appropriate number of bits corresponding to a pointer associated with the identified class code.

20. The method of claim 19, wherein shifting out in a block an appropriate number of bits comprises looking up the identified class code in a Huffinan table to determine the appropriate number of bits to shift out in a block.

21. The method of claim 19, further comprising shifting out a single bit representing a flag, the flag indicating whether or not a block of L bits representing a fixed length sequence of bits should be shifted out.

22. An imaging system comprising:
   a compressor to provide a data set of zero and non-zero values as compressed image data;
   a data packer to receive the compressed image data, to binary encode a data set of zero and non-zero values, and to pack the binary code into a memory; and
   a computer system coupled with the data packer, to access the memory and unpack and decode the packed binary encoded bits, by serially unpacking and decoding bit-by-bit a plurality of bits from a most significant bit to a least significant bit of a variable length sequence of bits and shifting out in blocks bits of a fixed length sequence.

23. The imaging system of claim 22, wherein serially unpacking and decoding comprises serially unpacking bit-by-bit a plurality of bits representing a class code and decoding the serially unpacked bits until the class code is identified, and wherein shifting out comprises shifting out in a block an appropriate number of bits corresponding to a pointer associated with the identified class code.

24. The imaging system of claim 23, further comprising shifting out a single bit representing a flag, the flag indicating whether or not a block of L bits representing a fixed length sequence of bits should be shifted out.

25. A method comprising:
   using a compressor to provide compressed image data to a data packer, the compressed image data comprised of a data set of zero and non-zero values;
   using the data packer to binary encode the compressed image data into a data set of zero and non-zero values and pack the binary code into a memory, and
   using a computer system that is coupled with the data packer to access the memory and unpack and decode the packed binary encoded bits, by serially unpacking and decoding bit-by-bit a plurality of bits from a most significant bit to a least significant bit of a variable length sequence of bits and shifting out in blocks bits of a fixed length sequence.

26. The method of claim 22, wherein serially unpacking and decoding comprises serially unpacking bit-by-bit a plurality of bits representing a class code and decoding the serially unpacked bits until the class code is identified, and wherein shifting out comprises shifting out in a block an appropriate number of bits corresponding to a pointer associated with the identified class code.

27. The method of claim 23, further comprising using the computer system to shift out a single bit representing a flag, the flag indicating whether or not a block of L bits representing a fixed length sequence of bits should be shifted out.

* * * * *